United States Patent
Su et al.

(10) Patent No.: US 12,414,404 B2
(45) Date of Patent: Sep. 9, 2025

(54) A/M/X CRYSTALLINE MATERIAL, PHOTOVOLTAIC DEVICE, AND PREPARATION METHODS THEREOF

(71) Applicant: CONTEMPORARY AMPEREX TECHNOLOGY (HONG KONG) LIMITED, Hong Kong (CN)

(72) Inventors: Shuojian Su, Ningde (CN); Zhaohui Liu, Ningde (CN); Yandong Wang, Ningde (CN); Yanfen Wang, Ningde (CN); Yongsheng Guo, Ningde (CN); Guodong Chen, Ningde (CN); Chuying Ouyang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/325,009

(22) Filed: May 29, 2023

(65) Prior Publication Data

US 2023/0299219 A1    Sep. 21, 2023

Related U.S. Application Data

(63) Continuation of application No. PCT/CN2021/140788, filed on Dec. 23, 2021.

(51) Int. Cl.
*H10F 77/12* (2025.01)
*C01G 21/00* (2006.01)
(Continued)

(52) U.S. Cl.
CPC ............ *H10F 77/12* (2025.01); *C01G 21/006* (2013.01); *H10F 10/174* (2025.01);
(Continued)

(58) Field of Classification Search
CPC ...... H01L 31/032; H10K 85/50; H10F 77/148
See application file for complete search history.

(56) References Cited

U.S. PATENT DOCUMENTS

| 6,608,326 B1 | 8/2003 | Shinagawa |
| 2017/0098514 A1 | 4/2017 | Geohegan et al. |

(Continued)

FOREIGN PATENT DOCUMENTS

| CN | 107849446 A | 3/2018 |
| CN | 108305937 A | 7/2018 |

(Continued)

OTHER PUBLICATIONS

Ding ("Material nucleation/growth competition tuning towards highly reproducible planar perovskite solar cells with efficiency exceeding 20%"). J. Mater. Chem. A, 2017, 5, 6840 (Year: 2017).*

(Continued)

*Primary Examiner* — Angelo Trivisonno
(74) *Attorney, Agent, or Firm* — K&L Gates LLP

(57) ABSTRACT

This application provides an A/M/X crystalline material, a photovoltaic device, and preparation methods thereof. The photovoltaic device includes a photoactive crystalline material layer (103). The photoactive crystalline material layer (103) includes a penetrating crystal grain (313), where the penetrating crystal grain (313) is a crystal grain penetrating through the photoactive crystalline material layer (103), and a percentage p of a quantity of penetrating crystal grains (313) in a total quantity of crystal grains of the photoactive crystalline material layer (103) is ≥80%. The photoactive crystalline material layer (103) includes a backlight side (113) and a backlight crystal grain (31, 32, 33), where the backlight crystal grain (31, 32, 33) is a crystal grain exposed to the backlight side (113) and has a backlight crystal face exposed to the backlight side (113). At least one region of the (Continued)

backlight side (113) has an average flatness index $R_{avg}$ being ≤75.

20 Claims, 3 Drawing Sheets

(51) Int. Cl.
- *H10F 10/174* (2025.01)
- *H10F 71/00* (2025.01)
- *H10F 77/14* (2025.01)
- *H10F 77/164* (2025.01)

(52) U.S. Cl.
CPC ......... *H10F 71/128* (2025.01); *H10F 77/148* (2025.01); *H10F 77/164* (2025.01); *C01P 2002/34* (2013.01); *C01P 2006/40* (2013.01)

(56) References Cited

U.S. PATENT DOCUMENTS

| | | |
|---|---|---|
| 2018/0248142 A1 | 8/2018 | Bakr et al. |
| 2021/0159426 A1 | 5/2021 | Huang et al. |

FOREIGN PATENT DOCUMENTS

| | | | |
|---|---|---|---|
| CN | 109496370 A | 3/2019 | |
| CN | 111710784 A | 9/2020 | |
| CN | 113272986 A | 8/2021 | |
| CN | 113416155 A | 9/2021 | |
| JP | 2002343993 A | 11/2002 | |
| JP | 2018536995 A | 12/2018 | |
| WO | 2020147939 A1 | 7/2020 | |
| WO | 2020209916 A2 | 10/2020 | |
| WO | WO-2021030491 A1 * | 2/2021 | ........... H01G 9/0036 |

OTHER PUBLICATIONS

Guo ("Sulfamic Acid-Catalyzed Lead Perovskite Formation for Solar Cell Fabrication on Glass or Plastic Substrates"). J. Am. Chem. Soc. 2016, 138, 5410-5416 (Year: 2016).*
The extended European search report received in the corresponding European Application 21963474.8, mailed Nov. 15, 2023.
International Search Report received in the corresponding International Application PCT/CN2021/140788, mailed Sep. 21, 2022.
Notice of Reasons for Refusal of JP Application No. 2024-536231, mailed May 7, 2025, 10 pages with English translation.
Xiping Liu et al, Additive Engineering by Bifunctional Guanidine Sulfamate for Highly Efficient and Stable Perovskites Solar Cells, Small 2020, 16, 2004817, 9 pages.
Mengjie Li et al, Monolithic MAPbI3 films for high-efficiency solar cells via coordination and a heat assisted process, Journal of Materials Chemistry A. 2017, 5, pp. 21313-21319.
Mengru Wang et al, Monolayer-like hybrid halide perovskite films prepared by additive engineering without antisolvents for solar cells, Journal of Materials Chemistry A. 2018, 6, pp. 15386-15394.
Shasha Zhang et al, Formamidine-assisted fast crystallization to fabricate formamidinium-based perovskite films for high-efficiency and stable solar cells, Journal of Materials Chemistry C. 2020, 8, pp. 1642-1648.
Communication pursuant to Article 94(3) EPC received in the counterpart EP application 21963474.8, dated Jul. 14, 2025, 10 pages.
Ding Bin et al: "Material nucleation/growth competition tuning towards highly reproducible planar perovskite solar cells with efficiency exceeding 20", Journal of Materials Chemistry A, vol. 5, No. 15, Jan. 1, 2017, (Jan. 1, 2017), pp. 6840-6848, XP093290289.

* cited by examiner (a)

(b)

A/M/X CRYSTALLINE MATERIAL, PHOTOVOLTAIC DEVICE, AND PREPARATION METHODS THEREOF

CROSS REFERENCE TO RELATED APPLICATIONS

The present application is a continuation of International Application PCT/CN2021/140788, filed Dec. 23, 2021 and entitled "A/M/X CRYSTALLINE MATERIAL, PHOTOVOLTAIC DEVICE, AND PREPARATION METHODS THEREOF", the entire disclosure of which is incorporated herein by reference.

TECHNICAL FIELD

This application relates to the field of photovoltaic technologies, and in particular, to an A/M/X crystalline material, a photovoltaic device, and preparation methods thereof.

BACKGROUND

A perovskite photovoltaic device is a photovoltaic device that uses a photoactive perovskite structure material as a photoactive crystalline material layer for photoelectric conversion.

Typical photoactive perovskite structure materials are organometallic halides with a general formula of $AMX_3$ and usually an octahedral or cubic structure. In a typical perovskite crystal, an A ion is located at the center of a cubic unit cell and surrounded by 12 X ions to produce a coordinated cubic octahedron, forming a three-dimensional periodic structure, and an M ion is located at an angular point of the cubic unit cell and surrounded by 6 X ions for coordination to form an octahedral symmetric structure.

The photoactive perovskite structure material under light irradiation forms two types of carriers: electrons and holes. Electrons and holes are respectively collected by two electrodes to produce a photo-generated current. Properties of the perovskite structure are key factors influencing power conversion efficiency (PCE) of photovoltaic devices.

SUMMARY

An objective of this application is to provide a photovoltaic device with higher power conversion efficiency.

A first aspect of this application provides a photovoltaic device. The photovoltaic device includes a photoactive crystalline material layer, and the photoactive crystalline material layer includes a first region;

in the first region, the photoactive crystalline material layer includes a penetrating crystal grain, where the penetrating crystal grain is a crystal grain penetrating through the photoactive crystalline material layer, and a percentage p of a quantity of penetrating crystal grains in a total quantity of crystal grains in the first region of the photoactive crystalline material layer is ≥80%, and optionally, p≥90%; and in the first region, the photoactive crystalline material layer includes a backlight side and a backlight crystal grain, where the backlight crystal grain is a crystal grain having at least one face exposed to the backlight side, and the face of the backlight crystal grain exposed to the backlight side is a backlight crystal face, where the backlight side has an average flatness index $R_{avg}$, where $R_{avg} \leq 75$, and optionally, $10 \leq R_{avg} \leq 70$; and $R_{avg}$ of the backlight side is calculated according to the following formula:

$$R_{avg} = \frac{\sum_{i=1}^{i=n} R_i}{n}$$

where $R_i$ is flatness index of the i-th backlight crystal grain in the first region, and $R_i$ is calculated according to the following formula:

$$R_i = d_i/h_i$$

where $d_i$ is width of a backlight crystal face of the i-th backlight crystal grain in the first region;

$h_i$ is protrusion height of the backlight crystal face of the i-th backlight crystal grain in the first region; and n is quantity of all backlight crystal grains in the first region.

The photovoltaic device based on the foregoing solution has enhanced power conversion efficiency.

In some embodiments, the photoactive crystalline material includes an A/M/X crystalline material, and the A/M/X crystalline material has the following general formula:

$$[A]_a[M]_b[X]_c$$

where [M] includes one or more first cations, and the first cation includes a metal ion, a metalloid ion, or a combination thereof;

[A] includes one or more second cations;

[X] includes one or more halogen anions;

a is 1 to 6, and optionally, a is 1, 2, 3, 4, 5, or 6;

b is 1 to 6, and optionally, b is 1, 2, 3, 4, 5, or 6; and c is 1 to 18, and optionally, c is 3, 6, 9, or 18.

The photovoltaic device based on the foregoing solution has enhanced power conversion efficiency.

In some embodiments, the one or more first cations are selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, or $Te^{4+}$; and optionally, the one or more first cations are selected from $Cu^{2+}$, $Pb^{2+}$, $Ge^{2+}$, or $Sn^{2+}$;

the one or more second cations are selected from $Cs^+$, $(NR^1R^2R^3R^4)^+$, $(R^1R^2N=CR^3R^4)^+$, $(R^1R^2N-C(R^5)=NR^3R^4)^+$, or $(R^1R^2N-C(NR^5R^6)=R^3R^4)^+$, where $R^1$, $R^2$, $R^3$, $R^4$, $R^5$, and $R^6$ each are independently selected from H, substituted or unsubstituted $C_{1-20}$ alkyl, or substituted or unsubstituted aryl;

optionally, the one or more second cations are selected from $Cs^+$, $(CH_3NH_3)^+$, or $(H_2N-C(H)=NH_2)^+$; and the halogen anion is selected from $Cl^-$, $Br^-$, or $I^-$.

The photovoltaic device based on the foregoing solution has enhanced power conversion efficiency.

In some embodiments, the A/M/X crystalline material includes $FAPbI_3$, $FAPbBr_3$, $FAPbCl_3$, $FAPbF_3$, $FAPbBr_xI_{3-x}$, $FAPbBr_xCl_{3-x}$, $FAPbI_xBr_{3-x}$, $FAPbI_xCl_{3-x}$, $FAPbCl_xBr_{3-x}$, $FAPbI_{3-x}Cl_x$, $CsPbI_3$, $CsPbBr_3$, $CsPbCl_3$, $CsPbF_3$, $CsPbBr_xI_{3-x}$, $CsPbBr_xCl_{3-x}$, $CsPbI_xBr_{3-x}$, $CsPbI_xCl_{3-x}$, $CsPbCl_xBr_{3-x}$, $CsPbI_{3-x}Cl_x$, $FA_{1-y}Cs_yPbI_3$, $FA_{1-y}Cs_yPbBr_3$, $FA_{1-y}Cs_yPbCl_3$, $FA_{1-y}Cs_yPbF_3$, $FA_{1-y}Cs_yPbBr_xI_{3-x}$, $FA_{1-y}Cs_yPbBr_xCl_{3-x}$, $FA_{1-y}Cs_yPbI_xBr_{3-x}$, $FA_{1-y}Cs_yPbI_xCl_{3-x}$, $FA_{1-y}Cs_yPbCl_xBr_{3-x}$, $FA_{1-y}Cs_yPbI_{3-x}Cl_x$, or a combination thereof, where x=0-3, and y=0.01-0.25.

The photovoltaic device based on the foregoing solution has enhanced power conversion efficiency.

In some embodiments, the A/M/X crystalline material includes FAPbI$_3$, CsPbI$_3$, FA$_{1-y}$Cs$_y$PbI$_3$, or a combination thereof, where y=0.01-0.25.

The photovoltaic device based on the foregoing solution has enhanced power conversion efficiency.

In some embodiments, thickness of the photoactive crystalline material layer is 100 nm or more, optionally 100 nm-1000 nm, and optionally 300 nm-700 nm.

The photovoltaic device based on the foregoing solution has enhanced power conversion efficiency.

In some embodiments, the photovoltaic device further includes a first charge transport layer and a second charge transport layer, and the photoactive crystalline material layer is located between the first charge transport layer and the second charge transport layer; and the first charge transport layer and the second charge transport layer are respectively an electron transport layer and a hole transport layer; or the first charge transport layer and the second charge transport layer are respectively a hole transport layer and an electron transport layer.

In some embodiments, the photovoltaic device further includes a first electrode and a second electrode, where an electron transport layer, a hole transport layer, and the photoactive crystalline material layer are located between the first electrode and the second electrode;

optionally, the first electrode includes transparent conductive oxide; and optionally, the second electrode includes metal.

The photovoltaic device based on the foregoing solution has enhanced power conversion efficiency.

A second aspect of this application provides a preparation method of A/M/X crystalline material. The A/M/X crystalline material has the following general formula:

where [M] includes one or more first cations, and the first cation includes a metal ion, a metalloid ion, or a combination thereof;

[A] includes one or more second cations;

[X] includes one or more halogen anions;

a is 1 to 6, for example, a=1;

b is 1 to 6, for example, b=1; and c is 1 to 18, for example, c=3; and the method includes providing a precursor composition on a substrate, where the precursor composition includes the following components:

(a) at least one precursor compound;

(b) a solvent;

(c) a surfactant; and (d) an amino compound.

With the A/M/X crystalline material prepared based on the foregoing solution applied to photovoltaic devices, the photovoltaic devices have enhanced power conversion efficiency.

In some embodiments, the surfactant includes an amphoteric surfactant. With the A/M/X crystalline material prepared based on the foregoing solution applied to photovoltaic devices, the photovoltaic devices have enhanced power conversion efficiency.

In some embodiments, the amino compound includes a nitrile-amine compound, an amino acid compound (for example, a sulfamic acid compound), a hydrazine compound, a urea compound (for example, urea, urea formaldehyde, biuret, and triuret), a guanidine compound, or a salt or hydrate thereof. With the A/M/X crystalline material prepared based on the foregoing solution applied to photovoltaic devices, the photovoltaic devices have enhanced power conversion efficiency.

In some embodiments, the surfactant includes dodecyl aminopropionate, dodecyl ethoxy sulphobetaine, dodecyl dimethyl hydroxypropyl sulphobetaine, zwitterionic polyacrylamide, octadecyl dihydroxyethyl amine oxide, tetradecyl dihydroxyethyl amine oxide, lauramidopropylamine oxide, lauryl betaine, L-α-phosphatidylcholine, 3-(N,N-dimethylmyristylammonio)propanesulfonate, dodecylbenzene sulfonate, or a combination thereof. With the A/M/X crystalline material prepared based on the foregoing solution applied to photovoltaic devices, the photovoltaic devices have enhanced power conversion efficiency.

In some embodiments, the amino compound includes urea formaldehyde (C$_3$H$_8$N$_2$O$_3$), N,N"-(isobutylidene)diurea (C$_6$H$_{14}$N$_4$O$_2$), hydrazine (H$_4$N$_2$), guanidine (CH$_3$N$_3$O), cyanamide (CH$_2$N$_2$), sulfamic acid (H$_3$NO$_3$S), or a combination thereof. With the A/M/X crystalline material prepared based on the foregoing solution applied to photovoltaic devices, the photovoltaic devices have enhanced power conversion efficiency.

In some embodiments, the precursor composition includes a first solvent and a second solvent, a boiling point of the first solvent is 40° C.-165° C., and a boiling point of the second solvent is 170° C.-250° C. With the A/M/X crystalline material prepared based on the foregoing solution applied to photovoltaic devices, the photovoltaic devices have enhanced power conversion efficiency.

In some embodiments, the first solvent is selected from one or more of N,N-dimethylformamide (DMF), 2-methoxyethanol, and acetonitrile (ACN). With the A/M/X crystalline material prepared based on the foregoing solution applied to photovoltaic devices, the photovoltaic devices have enhanced power conversion efficiency.

In some embodiments, the second solvent is selected from one or more of dimethyl sulfoxide (DMSO), N-methylpyrrolidone (NMP), and diphenyl sulfoxide (DPSO). With the A/M/X crystalline material prepared based on the foregoing solution applied to photovoltaic devices, the photovoltaic devices have enhanced power conversion efficiency.

In some embodiments, a volume ratio of the first solvent to the second solvent is (4-10):1. With the A/M/X crystalline material prepared based on the foregoing solution applied to photovoltaic devices, the photovoltaic devices have enhanced power conversion efficiency.

In some embodiments, the precursor composition includes:

a first precursor compound, where the first precursor compound contains a first cation; and a second precursor compound, where the second precursor compound contains a second cation.

With the A/M/X crystalline material prepared based on the foregoing solution applied to photovoltaic devices, the photovoltaic devices have enhanced power conversion efficiency.

In some embodiments, the first precursor compound contains a halogen anion. With the A/M/X crystalline material prepared based on the foregoing solution applied to photovoltaic devices, the photovoltaic devices have enhanced power conversion efficiency.

In some embodiments, the second precursor compound contains a halogen anion. With the A/M/X crystalline material prepared based on the foregoing solution applied to photovoltaic devices, the photovoltaic devices have enhanced power conversion efficiency.

In some embodiments, the first precursor compound includes lead iodide (PbI$_2$), lead bromide (PbBr$_2$), or a combination thereof.

In some embodiments, the second precursor compound includes formamidinium iodide (FAI), formamidinium bromide (FABr), cesium iodide (CsI), cesium bromide (CsBr), or a combination thereof.

With the A/M/X crystalline material prepared based on the foregoing solution applied to photovoltaic devices, the photovoltaic devices have enhanced power conversion efficiency.

In some embodiments, the preparation method of A/M/X crystalline material further includes a step of implementing curing treatment on the precursor composition provided on a surface of the substrate; and optionally, the curing treatment includes vacuum treatment, air blading treatment (air blading), infrared light treatment, or a combination thereof. With the A/M/X crystalline material prepared based on the foregoing solution applied to photovoltaic devices, the photovoltaic devices have enhanced power conversion efficiency.

In some embodiments, the preparation method of A/M/X crystalline material further includes implementing annealing treatment on a resulting product of the curing treatment;

optionally, a temperature of the annealing treatment is 100° C.-170° C.; and optionally, a time of the annealing treatment is 5 min-60 min.

With the A/M/X crystalline material prepared based on the foregoing solution applied to photovoltaic devices, the photovoltaic devices have enhanced power conversion efficiency.

A third aspect of this application provides a preparation method of photovoltaic device, where the photovoltaic device includes a first electrode and a second electrode, a first charge transport layer and a second charge transport layer that are located between the first electrode and the second electrode, and an A/M/X crystalline material layer located between the first charge transport layer and the second charge transport layer; and the method includes:
providing the first electrode whose surface is provided with the first charge transport layer;
forming the A/M/X crystalline material layer on a surface of the first charge transport layer according to the preparation method of A/M/X crystalline material according to any one of the foregoing implementations;
forming the second charge transport layer on the A/M/X crystalline material layer; and
forming the second electrode on the second charge transport layer, where
the first charge transport layer and the second charge transport layer are respectively an electron transport layer and a hole transport layer; or
the first charge transport layer and the second charge transport layer are respectively a hole transport layer and an electron transport layer.

The photovoltaic device prepared based on the foregoing solution has enhanced power conversion efficiency.

Beneficial Effects:

One or more technical solutions of this application exhibit one or more of the following beneficial effects:

(1) The photovoltaic device has significantly enhanced power conversion efficiency (Power Conversion Efficiency, PCE).

(2) The photoactive crystalline material layer has a relatively high percentage p of penetrating crystal grains.
(3) The photoactive crystalline material layer has a relatively low average flatness index $R_{avg}$.
(4) A synergistic effect between the surfactant and the nitrogen-containing compound is unexpectedly in the preparation method of photoactive crystalline layer.
(5) The preparation methods have low costs and high efficiency, and easy to use in large scale.

BRIEF DESCRIPTION OF DRAWINGS

(a) and (b) of FIG. 3 are schematic diagrams of photoactive crystalline material layers according to some embodiments and comparative embodiments of this application.

Figure 1:
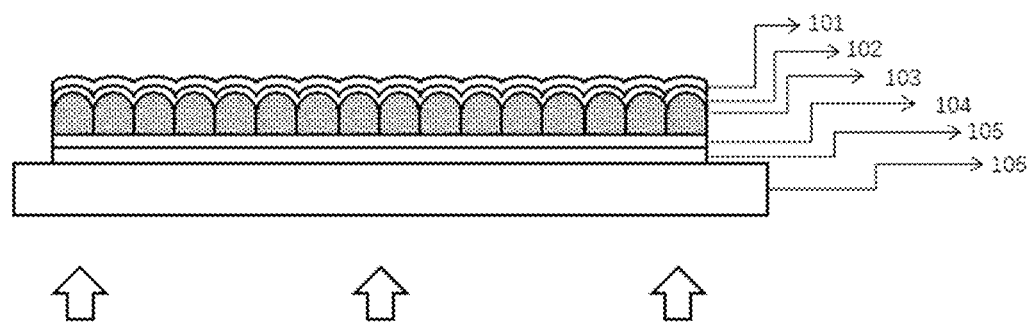
FIG. 1 is a schematic diagram of a photovoltaic device according to some embodiments of this application.

Reference signs are as follows:

106: substrate; 105: first electrode; 104: first charge transport layer; 103: photoactive crystalline material layer; 102: second charge transport layer; 101: second electrode; 313: penetrating crystal grain; 31, 32, 33: backlight crystal grain; $d_i$: width of backlight crystal grain; $h_i$: protrusion height of backlight crystal grain; 113: backlight side;

151: incident light; 152: reflected light; 112: light-receiving side; and 325: crystal boundary.

DESCRIPTION OF EMBODIMENTS

Implementations of an A/M/X crystalline material, a photovoltaic device, and preparation methods thereof specifically disclosed in this application are described in detail with appropriate reference to the accompanying drawings. However, unnecessary detailed descriptions are omitted. For example, detailed descriptions of well-known items and repeated descriptions of actually identical structures are omitted, to avoid unnecessary redundant descriptions below and facilitate understanding by persons skilled in the art. In addition, the accompanying drawings and the following descriptions are intended to help persons skilled in the art fully understand this application, rather than limiting the subject matter described in the claims.

A "range" disclosed in this application is confined by a lower limit and an upper limit, and a given range is defined by a lower limit and an upper limit that are selected. A selected lower limit and a selected upper limit define boundaries of a particular range. A range defined in this manner may include an end value or may not include an end value, and may have any combination, that is, any lower limit may be combined with any upper limit to form a range. For example, ranges of 60-120 and 80-110 are given for a particular parameter, indicating that the ranges of 60-110 and 80-120 are also predictable. In addition, if minimum range values 1 and 2 are given and maximum range values 3, 4, and 5 are given, the following ranges are all predictable: 1-3, 1-4, 1-5, 2-3, 2-4, and 2-5. In this application, unless otherwise stated, a value range of "a-b" is a short representation of any combination of real numbers between a and b, where both a and b are real numbers. For example, a value range "0-5" indicates that all real numbers between "0-5" have been listed in this specification, and "0-5" is only an abbreviated representation of a combination of these values. In addition, a parameter being described as an integer ≥2 is equivalent to a parameter being, for example, an integer of 2, 3, 4, 5, 6, 7, 8, 9, 10, 11, or 12.

Unless otherwise specified, all the implementations and optional implementations of this application may be combined to form a new technical solution.

Unless otherwise specified, all technical features and optional technical features of this application may be combined to form a new technical solution.

Unless otherwise specified, all steps in this application may be performed sequentially or randomly. For example, all the steps are performed sequentially. For example, if the method includes step (a) and step (b), it indicates that the method may include step (a) and step (b) performed sequentially, or may include step (b) and step (a) performed sequentially. For example, that the method may further include step (c) indicates that step (c) may be added to the method in any order. For example, the method may include step (a), step (b), and step (c), may include step (a), step (c), and step (b), may include step (c), step (a), and step (b), or the like.

Unless otherwise specified, "include" and "contain" mentioned in this application may be inclusive or exclusive. For example, "include" and "contain" may indicate that other components not listed may also be included or contained or that only listed components may be included or contained.

Unless otherwise specified, in this application, the term "or" is inclusive. For example, a phrase "A or B" means "A, B, or both A and B". More specifically, any one of the following conditions satisfies the condition "A or B": A is true (present) and B is false (not present); A is false (not present) and B is true (present); or both A and B are true (present).

[Photovoltaic Device]

A photovoltaic device (also referred to as photovoltaic cell or solar cell) is a device for converting solar energy into electrical energy.

Figure 2:
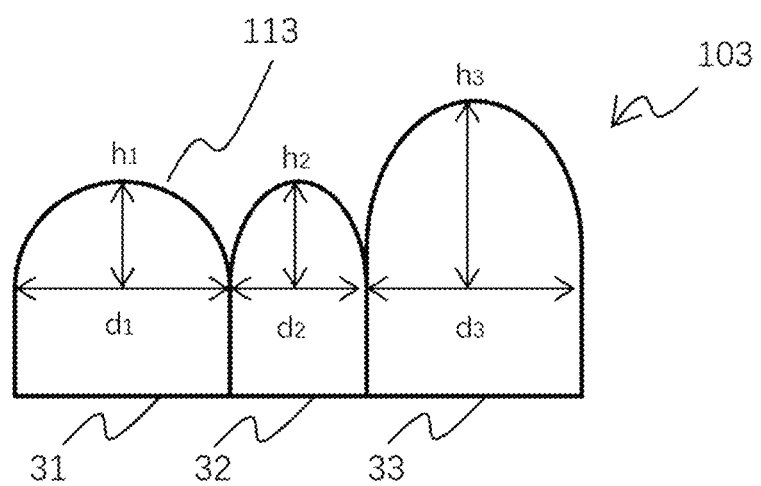
FIG. 2 is a schematic diagram of a photoactive crystalline material layer according to some embodiments of this application.

FIG. 1 is a schematic diagram of a photovoltaic device according to some embodiments of this application. FIG. 2 is a schematic diagram of a photoactive crystalline material layer according to some embodiments of this application.

With reference to FIG. 1 and FIG. 2, in some embodiments, this application provides a photovoltaic device. The photovoltaic device includes a photoactive crystalline material layer 103, and the photoactive crystalline material layer 103 includes a first region.

In the first region, the photoactive crystalline material layer 103 includes a penetrating crystal grain (penetrating crystal grain) 313, where the penetrating crystal grain 313 is a crystal grain (crystal grain) penetrating through the photoactive crystalline material layer 103, and a percentage p of a quantity of penetrating crystal grains 313 in a total quantity of crystal grains in the first region of the photoactive crystalline material layer 103 is ≥80%, optionally p≥90%, optionally p≥95%, optionally p≥99%, and optionally p=100%.

In the first region, the photoactive crystalline material layer 103 includes a backlight side (backlight side) 113 and a backlight crystal grain (backlight crystal grain) (31, 32, 33), where the backlight crystal grain (31, 32, 33) is a crystal grain having at least one face exposed to the backlight side 113, and the face of the backlight crystal grain (31, 32, 33) exposed to the backlight side 113 is a backlight crystal face (backlight crystal face).

The backlight side 113 has an average flatness index $R_{avg}$ (Average Flatness Index), $R_{avg} \leq 75$, and optionally, $10 \leq R_{avg} \leq 70$. Optionally, a value of $R_{avg}$ is 1-10, 10-20, 20-30, 30-40, 40-50, 50-60, or 60-70.

$R_{avg}$ of the backlight side 113 is calculated according to the following formula:

$$R_{avg} = \frac{\sum_{i=1}^{i=n} R_i}{n}$$

where $R_i$ is flatness index of the i-th backlight crystal grain (31, 32, 33) in the first region, and $R_i$ is calculated according to the following formula:

$$R_i = d_i/h_i$$

where $d_i$ is width of a backlight crystal face of the i-th backlight crystal grain (31, 32, 33) in the first region;

$h_i$ is protrusion height of the backlight crystal face of the i-th backlight crystal grain (31, 32, 33) in the first region; and n is quantity of all backlight crystal grains (31, 32, 33) in the first region.

With the foregoing solution, the inventors have unexpectedly found that power conversion efficiency of the photovoltaic device can be significantly improved by optimizing the shape and arrangement of crystal grains of the photoactive crystalline material layer. Specifically, the inventors have found that, when the percentage p of the quantity of penetrating crystal grains 313 in the photoactive crystalline material layer in the total quantity of crystal grains in the first region of the photoactive crystalline material layer 103 is ≥80%, and an average flatness index $R_{avg}$ of backlight crystal grains (31, 32, 33) in at least a partial region of the backlight side of the photoactive crystalline material layer is ≤75, the photovoltaic device has significantly enhanced power conversion efficiency (Power Conversion Efficiency, PCE).

With reference to FIG. 2, in some embodiments, a measurement and calculation solution of the average flatness index $R_{avg}$ is described in detail in FIG. 2. FIG. 2 shows the crystalline material layer 103. The photoactive crystalline material layer 103 includes the backlight side 113 and the backlight crystal grain (31, 32, 33), where the backlight crystal grain (31, 32, 33) is a crystal grain exposed to the backlight side 113, and the backlight crystal grain (31, 32, 33) has backlight crystal face exposed to the backlight side.

$R_{avg}$ of the backlight side 113 is calculated according to the following formula:

$$R_{avg} = \frac{\sum_{i=1}^{i=n} R_i}{n}$$

where $R_i$ is flatness index of the i-th backlight crystal grain (31, 32, 33) in the first region, and $R_i$ is calculated according to the following formula:

$$R_i = d_i/h_i$$

where $d_i$ is width ($d_1$, $d_2$, and $d_3$) of a backlight crystal face of the i-th backlight crystal grain (31, 32, 33) in the first region;

$h_i$ is protrusion height ($h_1$, $h_2$, and $h_3$) of the backlight crystal face of the i-th backlight crystal grain (31, 32, 33) in the first region; and n is quantity of all backlight crystal grains (31, 32, 33) in the first region.

In a region in which the photoactive crystalline layer 103 shown in FIG. 2 is located, a quantity n of all backlight crystal grains (31, 32, 33) is 3. Therefore, the value of i traverses from 1 to 3.

In some implementation solutions, a value of n is 3 or more, for example, 5 or more, 10 or more, 50 or more, 100 or more, 500 or more, or 1000 or more.

Figure 3:
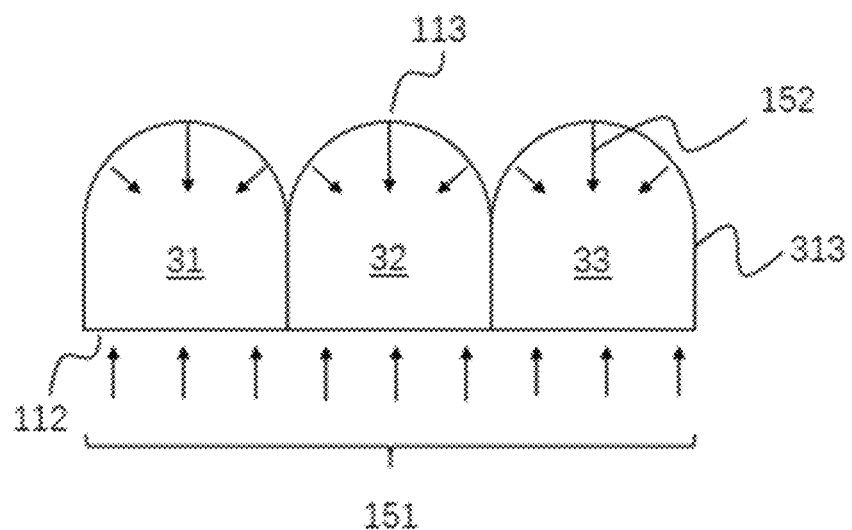
Figure 3:
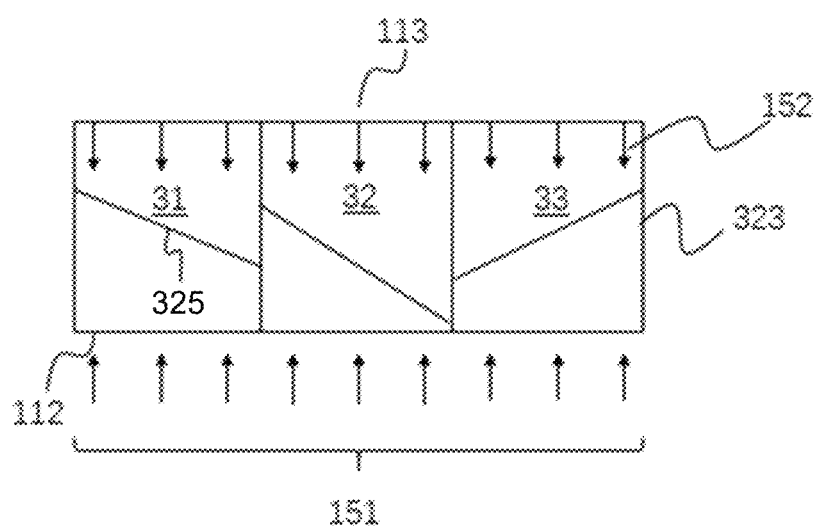

With reference to FIG. 3, (a) and (b) of FIG. 3 are schematic diagrams of two types of photoactive crystalline material layers.

(a) of FIG. 3 is a schematic diagram of a first photoactive crystalline material layer. As shown in the figure, a percentage p of a quantity of penetrating crystal grains 313 in the first photoactive crystalline material layer in a total quantity of crystal grains in an illustrated region of the photoactive crystalline material layer 103 is 100%. Incident light 151 is incident from a light-receiving side 112 of the first photoactive crystalline material layer, and the incident light 151 can reach a backlight side 113 almost unimpededly because the crystal grains of the first photoactive crystalline material layer are penetrating crystal grains 313. In this way, the first photoactive crystalline material layer can be sufficiently radiated by the incident light 151.

(b) of FIG. 3 is a schematic diagram of a comparative photoactive crystalline material layer. As shown in this figure, all crystal grains of the comparative photoactive crystalline material layer are non-penetrating crystal grains 323, and a percentage p of a quantity of penetrating crystal grains in a total quantity of crystal grains in an illustrated region of the photoactive crystalline material layer 103 is 0%. Incident light 151 is incident from a light-receiving side 112 of the comparative photoactive crystalline material layer, and the incident light 151 is reflected or refracted by a crystal boundary 325 before reaching a backlight side 113 because the crystal grains of the comparative photoactive crystalline material layer 313 are all non-penetrating crystal grains 323. As a result, the comparative photoactive crystalline material layer cannot fully absorb radiation energy of the incident light 151.

The flatness index is an index measuring a flatness degree of the surface of a crystal grain. A larger flatness index means a backlight crystal face of the crystal grain being more approximate to a plane, while a smaller flatness index means a higher protrusion degree of the backlight crystal face of the crystal grain.

With reference to (a) of FIG. 3, a flatness index of the backlight crystal grain (31, 32, 33) of the first photoactive crystalline material layer is relatively low (≤75), meaning that a ratio (d/h) of width to protrusion height of the backlight crystal grain (31, 32, 33) is relatively low. The backlight crystal grain (31, 32, 33) has a raised surface such that the backlight side 113 of the first photoactive crystalline material layer can allow most of reflected light 152 to be converged into the first photoactive crystalline material layer instead of being reflected out of the layer. In this way, the first photoactive crystalline material layer can fully utilize optical energy.

Still referring to (b) of FIG. 3, (b) of FIG. 3 is a schematic diagram of a comparative photoactive crystalline material layer. As shown in the figure, a flatness index of the backlight crystal grain (31, 32, 33) of the comparative photoactive crystalline material layer is relatively high (≥1000), meaning that, the backlight crystal grain (31, 32, 33) has a flat backlight crystal face. The flat backlight face reflects most of the reflected light 152 out of the layer. As a result, the comparative photoactive crystalline material layer 312 cannot fully utilize optical energy.

In some embodiments, the first region is a partial region or an entire region of the photoactive crystalline layer 103 in a surface direction of the layer.

In some embodiments, a size of the first region in at least one direction is 3 μm or more, for example, 10 μm or more, 100 μm or more, 1 mm or more, 1 cm or more, or 10 cm or more. Optionally, a size of the first region in at least two mutually perpendicular directions is 3 μm×3 μm or more, for example, 10 μm×10 μm or more, 100 μm×100 μm or more, 1 mm×1 mm or more, 1 cm×1 cm or more, 10 cm×10 cm or more, or 1 m×1 m or more.

In some embodiments, a total quantity of crystal grains in the first region of the photoactive crystalline layer is 9 (3×3) or more, for example, 16 (4×4) or more, 25 (5×5) or more, 64 (8×8) or more, 100 (10×10) or more, or 1000 or more.

In some implementation solutions, an area of the first region is equivalent to 10% or more of an area of one side of the photoactive crystalline layer, for example, 50% or more, 70% or more, 90% or more, or 100%.

In some embodiments, the photoactive crystalline layer 103 includes a plurality of crystal grains. A crystal grain penetrating through the photoactive crystalline material layer 103 is a penetrating crystal grain 313. A crystal grain having at least one face exposed to the backlight side 113 is a backlight crystal grain (31, 32, 33). It should be understood that a crystal grain may be both a penetrating crystal grain 313 and a backlight crystal grain (31, 32, 33), or a crystal grain may be only a backlight crystal grain (31, 32, 33) but not a penetrating crystal grain 313.

In some embodiments, the term "crystal" refers to a crystalline compound, which is a compound of an extended 3D crystal structure. The crystalline compound generally exists in a form of crystals; or exists in a form of microcrystals (for example, a plurality of crystals with a particle size less than or equal to 1 μm) when the crystalline compound is a polycrystalline compound. Crystals are usually gathered to form a layer. Crystals of a crystalline material may be of any size. Crystals with a size ranging from 1 nm to 1000 nm in one or more dimensions may be referred to as nanocrystals.

In some embodiments, the term "layer" refers to any structure that is substantially a stack (for example, the structure substantially extends in two vertical directions, but being limited in extension along a third vertical direction). The layer may have a thickness that varies within an extension range of the layer. Generally, the thickness of the layer is approximately constant. A "thickness" of a layer used in this specification is an average thickness of the layer, and the thickness of the layer can be easily measured, for example, by using a microscopic method such as an electron microscope determination method for a cross-section of a thin film, or by using a surface profile measurement method, for example, using a profilometer.

In some embodiments, the term "light-receiving side" is a side of the photovoltaic device facing toward a light source when the photovoltaic device is operating; and the term "backlight side" is a side of the photovoltaic device facing away from the light source when the photovoltaic device is operating.

In some embodiments, the term "crystal grain" used in this application means "single crystal grain". For example, a crystal grain is a single crystal grain, and a quantity of crystal grains is a quantity of single crystal grains. The term "single crystal grain" (single crystal grain) may be defined as "a single crystal of crystalline material that contains no large-angle boundaries or twin boundaries (a single crystal of crystalline material that contains no large-angle boundaries or twin boundaries)", as described in ASTM F1241.

In some embodiments, the term "penetrating through" means penetrating from one side of the photoactive crystalline layer to the other side, for example, from a light-receiving side to a backlight side.

In some implementation solutions, the protrusion height of the backlight crystal face is obtained by observing and measuring a micrograph of a cross-section of the photoactive crystalline material layer. In the micrograph of the cross-section, protrusion height of a profile of the backlight crystal face relative to a base plane of the backlight crystal face is defined as protrusion height of the backlight crystal face, and width of the profile of the backlight crystal face relative to the base plane of the backlight crystal face is defined as width of the backlight crystal face. The base plane of the backlight crystal face is a continuous and substantially flat plane substantially running through a lowest point of each backlight crystal face.

In some embodiments, the photoactive crystalline material includes an A/M/X crystalline material, and the A/M/X crystalline material has the following general formula:

$$[A]_a[M]_b[X]_c$$

where [M] includes one or more first cations, and the first cation includes a metal ion, a metalloid ion, or a combination thereof;
[A] includes one or more second cations;
[X] includes one or more halogen anions;
a is 1 to 6, and optionally, a is 1, 2, 3, 4, 5, or 6;
b is 1 to 6, and optionally, b is 1, 2, 3, 4, 5, or 6; and
c is 1 to 18, and optionally, c is 3, 6, 9, or 18. Based on the foregoing solution, the photovoltaic device has enhanced power conversion efficiency.

In some embodiments, the one or more first cations are selected from Ca2+, Sr2+, Cd2+, Cu2+, Ni2+, Mn2+, Fe2+, Co2+, Pd2+, Ge2+, Sn2+, Pb2+, Yb2+, Eu2+, $Bi^{3+}$, $Sb^{3+}$, Pd4+, W4+, Re4+, Os4+, Ir4+, Pt4+, Sn4+, Pb4+, Ge4+, or Te4+; and based on the foregoing solution, the photovoltaic device has enhanced power conversion efficiency.

In some embodiments, the one or more first cations are selected from $Cu^{2+}$, $Pb^{2+}$, $Ge^{2+}$, or $Sn^{2+}$. Based on the foregoing solution, the photovoltaic device has enhanced power conversion efficiency.

In some embodiments, the one or more second cations are selected from $Cs^+$, $(NR^1R^2R^3R^4)^+$, $(R^1R^2N=CR^3R^4)^+$, $(R^1R^2N-C(R^5)=NR^3R^4)^+$, or $(R^1R^2N-C(NR^5R^6)=R^3R^4)^+$, where $R^1$, $R^2$, $R^3$, $R^4$, $R^5$, and $R^6$ each are independently selected from H, substituted or unsubstituted $C_{1-20}$ alkyl, or substituted or unsubstituted aryl. Based on the foregoing solution, the photovoltaic device has enhanced power conversion efficiency.

In some embodiments, the one or more second cations are selected from $Cs^+$, $(CH_3NH_3)^+$, or $(H_2N-C(H)=NH_2)^+$. Based on the foregoing solution, the photovoltaic device has enhanced power conversion efficiency.

In some embodiments, the halogen anion is selected from $Cl^-$, $Br^-$, or $I^-$. Based on the foregoing solution, the photovoltaic device has enhanced power conversion efficiency.

In some embodiments, the A/M/X crystalline material includes $FAPbI_3$, $FAPbBr_3$, $FAPbCl_3$, $FAPbF_3$, $FAPbBr_xI_{3-x}$, $FAPbBr_xCl_{3-x}$,  $FAPbI_xBr_{3-x}$, $FAPbI_xCl_{3-x}$, $FAPbCl_xBr_{3-x}$, $FAPbI_{3-x}Cl_x$, $CsPbI_3$, $CsPbBr_3$, $CsPbCl_3$, $CsPbF_3$, $CsPbBr_xI_{3-x}$, $CsPbBr_xCl_{3-x}$, $CsPbI_xBr_{3-x}$, $CsPbI_xCl_{3-x}$, $CsPbCl_xBr_{3-x}$, $CsPbI_{3-x}Cl_x$, $FA_{1-y}Cs_yPbI_3$, $FA_{1-y}Cs_yPbBr_3$, $FA_{1-y}Cs_yPbCl_3$, $FA_{1-y}Cs_yPbF_3$, $FA_{1-y}Cs_yPbBr_xI_{3-x}$, $FA_{1-y}Cs_yPbBr_xCl_{3-x}$, $FA_{1-y}Cs_yPbI_xBr_{3-x}$, $FA_{1-y}Cs_yPbI_xCl_{3-x}$, $FA_{1-y}Cs_yPbCl_xBr_{3-x}$, $FA_{1-y}Cs_yPbI_{3-x}Cl_x$, or a combination thereof, where x=0-3, and y=0.01-0.25. Based on the foregoing solution, the photovoltaic device has enhanced power conversion efficiency.

In some embodiments, the A/M/X crystalline material includes $FAPbI_3$, $CsPbI_3$, $FA_{1-y}Cs_yPbI_3$, or a combination thereof, where y=0.01-0.25. Based on the foregoing solution, the photovoltaic device has enhanced power conversion efficiency.

In some embodiments, the A/M/X crystalline material is a perovskite material. Optionally, the A/M/X crystalline material is metal halide perovskite. The term "metal halide perovskite" is perovskite whose formula includes at least one metal cation and at least one halide anion. Optionally, the A/M/X crystalline material is mixed halide perovskite. The term "mixed halide perovskite" is perovskite or mixed perovskite containing at least two types of halide anions. Optionally, the A/M/X crystalline material is mixed cationic perovskite. The term "mixed cationic perovskite" refers to mixed perovskite containing at least two types of A cations. Based on the foregoing solution, the photovoltaic device has enhanced power conversion efficiency.

In some embodiments, the term "perovskite" is a material having a three-dimensional crystal structure associated with a three-dimensional crystal structure of $CaTiO_3$, or "perovskite" includes a layer material having a structure associated with a structure of $CaTiO_3$. The material having a three-dimensional crystal structure associated with a three-dimensional crystal structure of $CaTiO_3$ may also be referred to as perovskite having a "3D perovskite structure" or referred to as "3D perovskite". The structure of $CaTiO_3$ may be represented by a formula $AMX_3$, where A and M are cations of different sizes, and X is an anion. In a unit cell, the cation A is at (0, 0, 0), the cation M is at (½, ½, ½), and the anion X is at (½, ½, 0). The cation A is generally larger than the cation M in size. Persons skilled in the art understand that, as A, M, and X change, the structure of the perovskite material may change from the structure of $CaTiO_3$ to a distorted less-symmetrical structure due to different ion sizes. Materials containing a perovskite material layer are well known. For example, a material with a K2NiF4-type structure includes a perovskite material layer. Those referred to as "2D layered perovskite" in the art are structurally different from the 3D perovskite described above. The 2D layered perovskite may be represented by a formula $[A]_2[M][X]_4$, where [A] is at least one cation, [M] is at least one cation with a size different from that of the cation [A], and [X] is at least one anion.

In some embodiments, thickness of the photoactive crystalline material layer is 100 nm or more, optionally 100 nm-1000 nm, and optionally 300 nm-700 nm. Based on the foregoing solution, the photovoltaic device has enhanced power conversion efficiency.

In some embodiments, the photovoltaic device further includes a first charge transport layer 104 and a second charge transport layer 102, and the photoactive crystalline material layer 103 is located between the first charge transport layer 104 and the second charge transport layer 102.

The first charge transport layer 104 and the second charge transport layer 102 are respectively an electron transport layer and a hole transport layer; or
the first charge transport layer 104 and the second charge transport layer 102 are respectively a hole transport layer and an electron transport layer. Based on the foregoing solution, the photovoltaic device has enhanced power conversion efficiency.

In some embodiments, the photovoltaic device further includes a first electrode 105 and a second electrode 101, where an electron transport layer, a hole transport layer, and the photoactive crystalline material layer are located between the first electrode 105 and the second electrode 101.

Optionally, the first electrode 105 includes transparent conductive oxide.

Optionally, the second electrode 101 includes metal. Based on the foregoing solution, the photovoltaic device has enhanced power conversion efficiency.

In some embodiments, this application further provides a preparation method of A/M/X crystalline material. The A/M/X crystalline material has the following general formula:

where [M] includes one or more first cations, and the first cation includes a metal ion, a metalloid ion, or a combination thereof;
[A] includes one or more second cations;
[X] includes one or more halogen anions;
a is 1 to 6, for example, a=1;
b is 1 to 6, for example, b=1; and
c is 1 to 18, for example, c=3; and
the method includes providing a precursor composition on a substrate, where the precursor composition includes the following components:
(a) at least one precursor compound;
(b) a solvent;
(c) a surfactant; and
(d) an amino compound (organic nitrogen-containing compounds).

In the foregoing solution, the inventors have unexpectedly found that when the surfactant and the amino compound are jointly used to prepare the precursor composition of the A/M/X crystalline material, the resulting A/M/X crystalline material has both a relatively high penetrating crystal grain ratio and a relatively low flatness index. With the A/M/X crystalline material being applied to photovoltaic devices, the photovoltaic devices have enhanced power conversion efficiency.

In some implementation solutions, a concentration of at least one precursor compound in the precursor composition is 0.5 mol/L-2.5 mol/L, for example, 0.5 mol/L-1.5 mol/L or 1.5 mol/L-2.5 mol/L.

In some implementation solutions, a concentration of the surfactant in the precursor composition is 0.05 wt %-0.5 wt %, for example, 0.1 wt %-0.2 wt %, 0.2 wt %-0.3 wt %, 0.3 wt %-0.4 wt %, or 0.4 wt %-0.5 wt %.

In some implementation solutions, a concentration of the amino compound in the precursor composition is 1 wt %-1 wt %, for example, 2 wt %-4 wt %, 4 wt %-6 wt %, 6 wt %-8 wt %, or 8 wt %-10 wt %.

In some embodiments, the term "surfactant" refers to any amphiphilic compound (molecule or ion) that includes a hydrophilic part and a lipophilic part. The surfactant usually takes effect by accumulating at an oil-water interface such that the hydrophilic part faces toward an aqueous phase, while the hydrophilic part faces toward a hydrophobic phase, thereby reducing surface tension. Suitable surfactants include a water-insoluble surfactant, a water-dispersible surfactant, and a water-soluble surfactant.

In some embodiments, the surfactant includes an amphoteric surfactant.

The term "amphoteric surfactant" is a compound having cationic and anionic centers attached to a same molecule. Particularly, the cation part is based on primary amine cations, secondary amine cations, tertiary amine cations, or quaternary ammonium cations. The anionic part includes but is not limited to carboxylate, sulfonate, and phosphate. More particularly, the "amphoteric surfactant" refers to a compound having an $N^+$—O— functional group and a quaternary $N^+$ functional group bound to a functional group $C(O)O$—, $SO_3H$, or $SO_3$—, and a compound having a tertiary N functional group bound to a functional group $C(O)OH$, $C(O)O$—, $SO_3H$, or $SO_3$—.

For descriptions of amphoteric surfactants and their properties, refer to Amphoteric Surfactants, 2nd ed., E. G. Lomax, Ed., 1996, Marcel Dekker (Amphoteric Surfactants, 2nd ed., E. G. Lomax, Ed., 1996, Marcel Dekker). Such surfactants include: betaine, for example, fatty alkyl betaine, fatty alkylamide betaine, sulfobetaine, hydroxysulfobetaine, and betaine derived from imidazoline; amine oxide, for example, fatty alkyl amine oxide and fatty alkyl amide amine oxide; amphoteric glycine and amphoteric propionate; and so-called "balanced" amphoteric polycarboxy glycinate and amphoteric polycarboxy propionate.

In some embodiments, the amino compound includes a nitrile-amine compound, an amino acid compound, a hydrazine compound, a urea compound (for example, urea, urea formaldehyde, biuret, and triuret), a guanidine compound, or a salt or hydrate thereof.

In some embodiments, the term "amino compound" (amino compounds) is any compound containing at least one primary amine group, secondary amine group, tertiary amine group, or quaternary ammonium group.

In some embodiments, the amino compound is C1-C20 compounds, for example, C1-C15 compounds, C1-C10 compounds, C1-C5 compounds, or C15-C20 compounds.

In some embodiments, the term "nitrile-amine compound" is a compound containing at least one group "aminomethyl-cyano". Optionally, the "nitrile-amine compound" includes amino-nitrile (AAN), iminodiacetonitrile (IDAN), or ethylenediamine diacetonitrile (EDN).

In some embodiments, the term "amino acid" refers to a molecule having at least one amino group and at least one carboxyl group.

In some embodiments, the term "sulfamic acid compound" refers to a molecule containing at least one amino group and at least one sulfonic group.

In some embodiments, the term "hydrazine compound" includes hydrazine and substituted hydrazine.

In some embodiments, substitution means that an H atom of a to-be-substituted compound is substituted by one or more of the following groups: alkyl, alkenyl, alkynyl, cycloalkyl, cycloalkenyl, cycloalkynyl, aryl, heteroaryl, and heterocyclyl.

In some embodiments, the term "urea compound" is a compound having a group —$NR^1R^2$—$C(=S)$—$NR^3R^4$—, where $R^1$, $R^2$, $R^3$, and $R^4$ each are independently selected from H, alkyl, alkenyl, alkynyl, cycloalkyl, cycloalkenyl, cycloalkynyl, aryl, heteroaryl, and heterocyclyl. Optionally, the urea compound includes urea (urea), thiourea, urea formaldehyde, biuret, triuret, and substituents thereof.

In some embodiments, the surfactant includes dodecyl aminopropionate, dodecyl ethoxy sulphobetaine, dodecyl dimethyl hydroxypropyl sulphobetaine, zwitterionic polyacrylamide, octadecyl dihydroxyethyl amine oxide, tetradecyl dihydroxyethyl amine oxide, lauramidopropylamine oxide, lauryl betaine, L-α-phosphatidylcholine, 3-(N,N-dimethylmyristylammonio)propanesulfonate, dodecylbenzene sulfonate, or a combination thereof. Based on the foregoing solution, the photovoltaic device has enhanced power conversion efficiency. With the A/M/X crystalline material prepared based on the foregoing solution applied to photovoltaic devices, the photovoltaic devices have enhanced power conversion efficiency.

In some embodiments, the surfactant includes lauryl betaine, 3-(N,N-dimethylmyristylammonio)propanesulfonate, lauramidopropylamine oxide, L-α-phosphatidylcholine, or a combination thereof. With the A/M/X crystalline material prepared based on the foregoing solution applied to photovoltaic devices, the photovoltaic devices have enhanced power conversion efficiency.

In some embodiments, the amino compound includes urea formaldehyde ($C_3H_8N_2O_3$), N,N"-(isobutylidene)diurea ($C_6H_{14}N_4O_2$), hydrazine ($H_4N_2$), guanidine ($CH_3N_3O$), cyanamide ($CH_2N_2$), sulfamic acid ($H_3NO_3S$), or a combination thereof. Based on the foregoing solution, the photovoltaic device has enhanced power conversion efficiency. With the A/M/X crystalline material prepared based on the foregoing solution applied to photovoltaic devices, the photovoltaic devices have enhanced power conversion efficiency.

In some embodiments, the amino compound includes guanidine, sulfamic acid, urea, or a combination thereof. With the A/M/X crystalline material prepared based on the foregoing solution applied to photovoltaic devices, the photovoltaic devices have enhanced power conversion efficiency.

In some embodiments, the precursor composition includes a first solvent and a second solvent. A boiling point of the first solvent is 40° C.-165° C. (for example, 40° C.-60° C., 60° C.-80° C., 80° C.-100° C., 100° C.-120° C., 120° C.-140° C., or 140° C.-160° C.). A boiling point of the second solvent is 170° C.-250° C. (for example, 170° C.-190° C., 190° C.-210° C., 210° C.-230° C., or 230° C.-250° C.). In this solution, the first solvent with a specific boiling point and the second solvent with a specific boiling point being used together can effectively improve film formation coverage and crystal quality of the A/M/X crystalline material.

In some embodiments, the first solvent is selected from one or more of N,N-dimethylformamide (DMF), 2-methoxyethanol, and acetonitrile (ACN). With the A/M/X crystalline material prepared based on the foregoing solution applied to photovoltaic devices, the photovoltaic devices have enhanced power conversion efficiency.

In some embodiments, the second solvent is selected from one or more of dimethyl sulfoxide (DMSO), N-methylpyrrolidone (NMP), and diphenyl sulfoxide (DPSO). With the A/M/X crystalline material prepared based on the foregoing solution applied to photovoltaic devices, the photovoltaic devices have enhanced power conversion efficiency.

In some embodiments, a volume ratio of the first solvent to the second solvent is (4-10):1. The first solvent with a specific boiling point and the second solvent with a specific boiling point being used together at the foregoing specific ratio can effectively improve film formation coverage and crystal quality of the A/M/X crystalline material.

In some embodiments, the precursor composition includes:
  a first precursor compound, where the first precursor compound contains a first cation; and
  a second precursor compound, where the second precursor compound contains a second cation. With the A/M/X crystalline material prepared based on the foregoing solution applied to photovoltaic devices, the photovoltaic devices have enhanced power conversion efficiency.

In some embodiments, the first precursor compound contains a halogen anion. With the A/M/X crystalline material prepared based on the foregoing solution applied to photovoltaic devices, the photovoltaic devices have enhanced power conversion efficiency.

In some embodiments, the second precursor compound contains a halogen anion. With the A/M/X crystalline material prepared based on the foregoing solution applied to photovoltaic devices, the photovoltaic devices have enhanced power conversion efficiency.

In some embodiments, the first precursor compound includes lead iodide ($PbI_2$), lead bromide ($PbBr_2$), or a combination thereof. With the A/M/X crystalline material prepared based on the foregoing solution applied to photovoltaic devices, the photovoltaic devices have enhanced power conversion efficiency.

In some embodiments, the second precursor compound includes formamidinium iodide (FAI), formamidinium bromide (FABr), cesium iodide (CsI), cesium bromide (CsBr), or a combination thereof. With the A/M/X crystalline material prepared based on the foregoing solution applied to photovoltaic devices, the photovoltaic devices have enhanced power conversion efficiency.

In some embodiments, the preparation method of A/M/X crystalline material further includes a step of implementing curing treatment on the precursor composition provided on a surface of the substrate.

Optionally, the curing treatment includes vacuum treatment, air blading treatment (air blading), infrared light treatment, or a combination thereof. With the A/M/X crystalline material prepared based on the foregoing solution applied to photovoltaic devices, the photovoltaic devices have enhanced power conversion efficiency.

In some embodiments, the preparation method of A/M/X crystalline material further includes implementing annealing treatment on a resulting product of the curing treatment. With the A/M/X crystalline material prepared based on the foregoing solution applied to photovoltaic devices, the photovoltaic devices have enhanced power conversion efficiency.

In some implementation solutions, a temperature of the annealing treatment is 100° C.-170° C. (for example, 100° C.-120° C., 120° C.-140° C., 140° C.-160° C., or 160° C.-170° C.). With the A/M/X crystalline material prepared based on the foregoing solution applied to photovoltaic devices, the photovoltaic devices have enhanced power conversion efficiency.

In some implementation solutions, a time of the annealing treatment is 5 min-60 min (for example, 5 min-15 min, 15 min-25 min, 25 min-35 min, 35 min-45 min, or 45 min-55 min). With the A/M/X crystalline material prepared based on the foregoing solution applied to photovoltaic devices, the photovoltaic devices have enhanced power conversion efficiency.

In some embodiments, this application further includes a preparation method of photovoltaic device. The photovoltaic device includes a first electrode 105, a second electrode 101, a first charge transport layer 104 and a second charge transport layer 102 that are located between the first electrode 105 and the second electrode 101, and an A/M/X crystalline material layer located between the first charge transport layer 104 and the second charge transport layer 102.

The method includes:
providing the first electrode 105 with the first charge transport layer 104 provided on a surface;
forming the A/M/X crystalline material layer on a surface of the first charge transport layer 104 according to the preparation method of A/M/X crystalline material according to any one of the foregoing implementations;
forming the second charge transport layer 102 on the A/M/X crystalline material layer; and
forming the second electrode 101 on the second charge transport layer 102.

The first charge transport layer 104 and the second charge transport layer 102 are respectively an electron transport layer and a hole transport layer; or
the first charge transport layer 104 and the second charge transport layer 102 are respectively a hole transport layer and an electron transport layer. The photovoltaic device based on the foregoing solution has enhanced power conversion efficiency.

In some embodiments, the photovoltaic device may include the following layers arranged in the following order:
the first electrode (including, for example, transparent conductive oxide);
the first charge transport material layer (for example, a hole transport material layer);
a photoactive crystalline material layer;
the second charge transport material layer (for example, an electron transport material layer); and
the second electrode (including, for example, elemental metal), where the photovoltaic device prepared based on the foregoing solution has enhanced power conversion efficiency.

In some embodiments, the photovoltaic device may include the following layers arranged in the following order:
the first electrode (including, for example, transparent conductive oxide);
the first charge transport material layer (for example, an electron transport material layer);
a photoactive crystalline material layer;
the second charge transport material layer (for example, a hole transport material layer); and
the second electrode (including, for example, elemental metal), where the photovoltaic device prepared based on the foregoing solution has enhanced power conversion efficiency.

[Photoactive Crystalline Material Layer]

In some embodiments, the "photoactive crystalline material" is a material that can absorb light and subsequently generate free carriers (for example, electrons and holes).

In some embodiments, the photoactive crystalline material can generally absorb and/or emit photons in a visible region of a spectrum, for example, photons in a blue light region of a visible spectrum. Therefore, the photoactive crystalline material may be described as a light-emitting material (that is, a material that can emit light) or a light-absorbing material (that is, a material that can absorb light). For example, the photoactive crystalline material can emit and/or absorb at least one type of photons with a wavelength of 450 nm to 700 nm, for example, 450 nm to 650 nm.

In some embodiments, the photoactive crystalline material may include an A/M/X crystalline material greater than or equal to 5 wt %. For example, the photoactive crystalline material includes an A/M/X crystalline material greater than or equal to 80 wt %, for example, an A/M/X crystalline material greater than or equal to 95 wt % or an A/M/X crystalline material greater than or equal to 99 wt %. The photoactive crystalline material may include or substantially include an A/M/X crystalline material.

In some embodiments, the photoactive crystalline material is, for example, solid.

In some embodiments, the photoactive crystalline material layer includes a thin film of an A/M/X crystalline material. Generally, the A/M/X crystalline material is polycrystalline. Therefore, the photoactive crystalline material correspondingly includes a polycrystalline A/M/X crystalline material.

In some embodiments, the photoactive crystalline material layer may include a plurality of layers. Some or all of the layers may include an A/M/X crystalline material.

In some embodiments, the A/M/X crystalline material may be uniformly or non-uniformly distributed at the entire photoactive crystalline material layer. For example, the photoactive crystalline material may include a layer, and the layer is a layer substantially including or only including an A/M/X crystalline material. Alternatively or additionally, the photoactive crystalline material may include a substrate provided with an A/M/X crystalline material (for example, in a powder form or a thin film form).

[Electron Transport Layer]

In some embodiments, the electron transport layer is a layer containing an electron transport material (also referred to as n-type semiconductor material). The electron transport material may be a single type of electron transport compound or elemental material, or a mixture of two or more types of electron transport compounds or elemental materials. The electron transport compound or the elemental material may be undoped or doped with one or more doping elements.

Instances of the electronic transport material are known to persons skilled in the art.

The electron transport material may include fullerene or fullerene derivative, for example, C60, C70, PCBM, PC71BM, bis[C60]BM (that is, bis-C60-methyl butyrate), or ICBA (CAS: 1207461-57-1).

The electron transport material may include an organic electron transport material, for example, perylene or its derivative, P(NDI2OD-T2) (CAS: 1100243-40-0), or bathocuproine (BCP).

The electron transport material may include inorganic electron transport materials, for example, metal oxide, metal sulfide, metal selenide, metal telluride, perovskite, amorphous silicon, n-type group IV semiconductor, n-type group III-V semiconductors, n-type group II-VI semiconductors, n-type group I-VII semiconductors, n-type group IV-VI semiconductors, n-type group V-VI semiconductors, and n-type group II-V semiconductors, and any of them may be doped or undoped.

[Hole Transport Layer]

In some embodiments, the hole transport layer is a layer containing a hole transport material (also referred to as p-type semiconductor material).

Instances of the hole transport material are known to persons skilled in the art. The hole transport material may be a single type of hole transport compound or elemental material, or a mixture of two or more types of hole transport compounds or elemental materials. The hole transport compound or the elemental material may be undoped or doped with one or more doping elements.

An organic hole transporting material may include, for example, spiro-OMeTAD, P3HT, PCPDTBT, poly-TPD, spiro(TFSI)$_2$, and PVK.

The inorganic hole transport material may include nickel oxide (for example, NiO), vanadium oxide, copper oxide, or molybdenum oxide; CuI, CuBr, CuSCN, Cu$_2$O, CuO, or CIS; perovskite; amorphous silicon; p-type group IV semiconductor, p-type group III-V semiconductors, p-type group II-VI semiconductors, p-type group I-VII semiconductors, p-type group IV-VI semiconductors, p-type group V-VI semiconductors and p-type group II-V semiconductors, and these inorganic materials may be doped or undoped.

[Electrode]

The term "electrode" represents a region or a layer including or substantially including an electrode material.

The photovoltaic device in this application may further include a first electrode and a second electrode.

The first electrode may include metal (for example, silver, gold, aluminum, or tungsten), an organic conductive material such as PEDOT:PSS, or transparent conductive oxide (for example, fluorine-doped tin oxide (FTO), aluminum-doped zinc oxide (AZO), or indium-doped tin oxide (ITO)). Generally, the first electrode is a transparent electrode. Therefore, the first electrode generally includes transparent conductive oxide, for example, FTO, ITO, or AZO. A layer thickness of the first electrode is, for example, 10 nm to 1000 nm or 40 nm to 400 nm.

The foregoing limitation on the first electrode is also applicable to the second electrode. For example, the second electrode may include metal (for example, silver, gold, aluminum, or tungsten), an organic conductive material (for example, PEDOT:PSS), or transparent conductive oxide (for example, fluorine-doped tin oxide (FTO), aluminum-doped zinc oxide (AZO), or indium-doped tin oxide (ITO)). Generally, the second electrode includes metal (for example, elemental metal) or substantially includes metal (for example, elemental metal). A material of the second electrode may include metal or an instance substantially including metal, for example, silver, gold, copper, aluminum, platinum, palladium, or tungsten. The second electrode may be formed through vacuum evaporation. A material layer thickness of the second electrode is, for example, 10 nm to 1000 nm or 50 nm to 150 nm.

EXAMPLES

The technical solutions in this application are described in detail below with reference to specific examples and comparative examples. Unless otherwise specified, reagents, methods, and devices used in this application are conventional food grade reagents, methods, and devices in the art. Unless otherwise specified, test conditions used in the examples in this application are conventional test conditions in the art. Unless otherwise specified, reagents used in the examples in this application are commercially available.

CAS numbers of some raw materials and reagents are given below:

| | CAS |
|---|---|
| 3-(N,N-dimethylmyristylammonio)propanesulfonate | 14933-09-6 |
| Lauryl betaine | 683-10-3 |
| Lauramidopropylamine oxide | 61792-31-2 |
| L-α-phosphatidylcholine | 8002-43-5 |

Example 1

Referring to FIG. 1, in a light irradiation direction denoted by arrows in the figure, a photovoltaic device in Example 1 includes a substrate 106, a first electrode 105, a first charge transport layer 104, a photoactive crystalline material layer 103, a second charge transport layer 102, and a second electrode 101 that are stacked in sequence.

A preparation method of photovoltaic device in Example 1 is as follows:

(1) 1362 mg of formamidine hydroiodide (FAI), 228.6 mg of cesium iodide (CsI), and 4056.9 mg of lead iodide (PbI$_2$) were dissolved in 8 mL of solvent to prepare a perovskite precursor solution, where a molar concentration of FAI was 0.99 mol/L, a molar concentration of CsI was 0.11 mol/L, and a molar concentration of PbI$_2$ was 1.1 mol/L. The solvent was a mixture of DMF (N,N-dimethylformamide) and NMP (N-methylpyrrolidone) at a volume ratio of 7:1. Then, a surfactant and a nitrogen-containing compound were further added to the foregoing solvent, where weight percentages of the surfactant and the nitrogen-containing compound were 0.1 wt % and 5 wt %, respectively. In Example 1, the surfactant was lauryl betaine, and the nitrogen-containing compound was urea.

(2) 2 cm×2 cm FTO conductive glass was provided (the FTO conductive glass is glass covered with an FTO conductive layer, where FTO is an abbreviation of fluorine doped tin oxide). The FTO conductive glass included a glass plate and an FTO conductive layer deposited on the glass plate. The FTO conductive layer with a width of 0.66 cm at two opposite edges of the FTO conductive glass was removed by using a laser engraving technique (laser engraving technique), to retain a 2 cm×1.34 cm FTO conductive layer on the FTO conductive glass. Herein, the glass plate acted as the substrate 106, and the FTO conductive layer acted as the first electrode 105.

(3) The first charge transport layer 104 (nickel oxide layer) was formed on the first electrode 105 (FTO conductive layer) by using a magnetron sputtering technique, where thickness of the nickel oxide layer was approximately 20 nm. The first charge transport layer 104 acted as a hole transport layer.

(4) The precursor solution was applied onto a nickel oxide layer. Then, the sample was transferred to a vacuum chamber and left standing for 120 seconds at a vacuum degree less than 100 Pa, so that the precursor solution was cured to form a film. The cured sample was placed on a heating stage for annealing treatment at 150° C. for 30 min. After the annealing treatment was completed, a decent A/M/X crystalline material layer was formed on the nickel oxide layer. In this example, a composition of the A/M/X crystalline material was FA$_{0.9}$Cs$_{0.1}$PbI$_3$, and the A/M/X crystalline material layer acted as the photoactive crystalline material layer 103.

(5) The sample obtained in the previous step was placed in an evaporation system, and the second charge transport layer 102 was deposited on the photoactive crystalline material layer 103. Herein, the second charge transport layer 102 was an electron transport layer. The second charge transport layer included a C$_{60}$ (fullerene) layer with a thickness of 30 nm and a BCP (bathocuproine, bathocuproine) layer with a thickness of 8 nm that are sequentially formed through evaporation.

(6) In the evaporation system, the second electrode 101 was formed on the second charge transport layer 102. The second electrode 101 was a metal copper layer with a thickness of 100 nm. In this way, the photovoltaic device in Example 1 was obtained.

Examples 2 to 4

Examples 2 to 4 differ from Example 1 in the type of surfactant and/or nitrogen-containing compound in the precursor solution.

Detailed differences in surfactants and nitrogen-containing compounds are shown in Table 1.

Comparative Examples 1 to 8

Comparative Example 1 differs from Example 1 in that the precursor solution contained no surfactant or nitrogen-containing compound.

Comparative Examples 2 to 8 differ from Example 1 in that the precursor solution contained no surfactant and contained a different type or amount of nitrogen-containing compound.

Detailed differences in surfactants and nitrogen-containing compounds are shown in Table 1.

Figure 4:
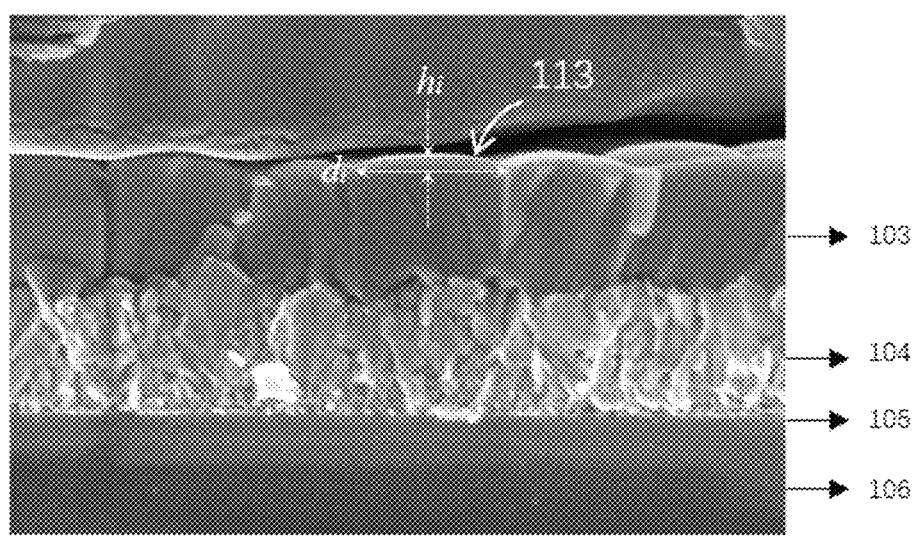
FIG. 4 is a scanning electron microscope photograph of intermediate products containing a photoactive crystalline material layer according to some embodiments of this application.

Analysis and Testing
1. Morphology Characterization:
   (1) Sample preparation: Steps (1) to (4) were performed according to the method in Example 4, and a product in step (6) was used as an observation sample. A glass cutter was used to scratch a straight line on one side of a glass plate for sample observation, and then a photovoltaic device was broken along the scratch to expose its section.
   (2) Sample observation: The section was observed by using a scanning electron microscope (SEM) and a photograph was taken at a magnification of 30000 times. The photograph is shown in FIG. 4. The observation sample includes a substrate 106, a first electrode 105 stacked on the substrate 106, a first charge transport layer 104 stacked on the first electrode 105, and a photoactive crystalline material layer 103 stacked on the first charge transport layer 104.
   (3) Crystal morphology of the photoactive crystalline material layer As shown in FIG. 4, in a photograph region, a section length of the photoactive crystalline material layer 103 is 3.7 µm, and a total quantity of intact crystal grains in the region is 4.

First, the photoactive crystalline material layer 103 includes a penetrating crystal grain 313, where the penetrating crystal grain 313 is a crystal grain penetrating through the photoactive crystalline material layer 103, a quantity of penetrating crystal grains 313 is 4, and a percentage p of the quantity of penetrating crystal grains 313 in a total quantity of crystal grains in an illustrated region of the photoactive crystalline material layer 103 is equal to 100%.

Second, the photoactive crystalline material layer 103 includes a backlight side 113 and a backlight crystal grain, where the backlight crystal grain is a crystal grain exposed to the backlight side 113, and the backlight crystal grain has a backlight crystal face exposed to the backlight side 113.

In the photograph region, the backlight side has an average flatness index $R_{avg}=11.4$.

$R_{avg}$ of the backlight side in the photograph region is calculated according to the following formula:

$$R_{avg} = \frac{\sum_{i=1}^{i=n} R_i}{n}$$

where $R_i$ is flatness index of the i-th backlight crystal grain in the photograph region, and $R_i$ is calculated according to the following formula:

$$R_i = d_i/h_i$$

where $d_i$ is width of a backlight crystal face of the i-th backlight crystal grain (31, 32, 33) in the photograph region;

$h_i$ is protrusion height of the backlight crystal face of the i-th backlight crystal grain (31, 32, 33) in the photograph region; and n is quantity of all the backlight crystal grains in the region.

Products obtained in steps (6) according to the methods in Examples 1 to 4 and Comparative Examples 1 to 8 were all observed by a scanning electron microscope, 3.7 µm long sections of photoactive crystalline material layers were collected, and the following were calculated:
   (1) percentage p of the quantity of penetrating crystal grains 313 in the total quantity of crystal grains in the photograph region of the photoactive crystalline material layer; and
   (2) the average flatness index $R_{avg}$ of the backlight side. Specific results are given in Table 1.

2. Characterization of Power Conversion Efficiency

For photovoltaic devices obtained according to the methods in Examples 1 to 4 and Comparative Examples 1 to 8, power conversion efficiency (PCE) of the photovoltaic devices was tested under irradiation of standard simulated sunlight (AM 1.5G, 100 mW/cm$^2$). For details about the test method, refer to this document: Stabilizing perovskite-substrate interfaces for high-performance perovskite modules, Science 373, 902 (2021). Test results are shown in Table 1.

TABLE 1

|  | Precursor solution | | Photoactive crystalline material layer | | Photovoltaic device | |
| --- | --- | --- | --- | --- | --- | --- |
|  | Surfactant/content | Nitrogen-containing compound/content | p (%) | $R_{avg}$ | PCE (%) | Increase rate |
| Comparative Example 1 | None | None | 0 | 2000 | 16 | — |
| Comparative Example 2 | None | Guanidine, 5 wt % | 40 | 1817 | 16.5 | 3% |
| Comparative Example 3 | None | Sulfaminic acid, 5 wt % | 40 | 1340 | 17.1 | 7% |

TABLE 1-continued

| | Precursor solution | | Photoactive crystalline material layer | | Photovoltaic device | |
|---|---|---|---|---|---|---|
| | Surfactant/content | Nitrogen-containing compound/content | p (%) | $R_{avg}$ | PCE (%) | Increase rate |
| Comparative Example 4 | None | Urea, 5 wt % | 80 | 1000 | 18.9 | 18% |
| Comparative Example 5 | 3-(N,N-dimethylmyristyl-ammonio)propane-sulfonate, 0.1 wt % | None | 14 | 70 | 16.4 | 2% |
| Comparative Example 6 | Lauryl betaine, 0.1 wt % | None | 0 | 251 | 16.5 | 3% |
| Comparative Example 7 | Lauramidopropylamine oxide, 0.1 wt % | None | 4 | 170 | 17.3 | 8% |
| Comparative Example 8 | L-α-phosphatidylcholine, 0.1 wt % | None | 2 | 10 | 17.9 | 12% |
| Example 1 | Lauryl betaine, 0.1 wt % | urea, 5 wt % | 100 | 59 | 20.1 | 26% |
| Example 2 | 3-(N,N-dimethylmyristyl-ammonio)propane-sulfonate, 0.1 wt % | Guanidine, 5 wt % | 83 | 40 | 20.5 | 28% |
| Example 3 | Lauramidopropylamine oxide, 0.1 wt % | Sulfaminic acid, 5 wt % | 82 | 26 | 21 | 31% |
| Example 4 | L-α-phosphatidylcholine, 0.1 wt % | Urea, 5 wt % | 100 | 16 | 21.1 | 32% |

Analysis Conclusion:

(1) Photovoltaic Device

The photovoltaic devices in Examples 1 to 4 have power conversion efficiency of 20.1% to 21.1%, significantly higher than those of the photovoltaic devices in Comparative Examples 1 to 8. The photovoltaic devices in Comparative Examples 1 to 8 have power conversion efficiency of only 16.0% to 18.9%.

The significantly higher power conversion efficiency of the photovoltaic devices in Examples 1 to 4 is attributed to the fact that the photoactive crystalline layers of the photovoltaic devices satisfy both the following characteristics (a) and (b).

(a) The percentage p of the quantity of penetrating crystal grains 313 in the total quantity of crystal grains in the photograph region of the photoactive crystalline material layer is ≥80%. For example, p=100%.

(b) The backlight side has an average flatness index $R_{avg}$ being ≤75. For example, $R_{avg}$ is 16-59.

(2) Synergistic Effect Between the Surfactant and the Nitrogen-Containing Compound Compared with Comparative Examples 1 to 8, in Examples 1 to 4, the precursor solution contains a surfactant and a nitrogen-containing compound in addition to a precursor compound.

It is found in this application that it is difficult to obtain a photoactive crystalline material layer with a percentage p of penetrating crystal grains 313 being ≥80% and an average flatness index $R_{avg}$ being ≤75. As shown in Comparative Examples 1 to 8, when no surfactant and no nitrogen-containing compound are added, or only a surfactant is added, or only a nitrogen-containing compound is added to the precursor solution, a photoactive crystalline material layer with a percentage p of penetrating crystal grains 313 being ≥80% and an average flatness index $R_{avg}$ being ≤75 cannot be obtained. Therefore, a photoactive crystalline material layer with improved light absorption property cannot be obtained.

It is unexpectedly found in this application that a photoactive crystalline material layer with a percentage p of penetrating crystal grains 313 being ≥80% and an average flatness index $R_{avg}$ being ≤75 can be successfully obtained when both a surfactant and a nitrogen-containing compound are added to a precursor solution.

It should be noted that a synergistic effect is present between the surfactant and the nitrogen-containing compound which significantly improves photoelectric conversion performance of the photoactive crystalline material layer. In the last column of Table 1, using light conversion efficiency in Comparative Example 1 as a blank benchmark, increase rates of light conversion efficiency in the other comparative examples and Examples 1 to 4 with respect to that in Comparative Example 1 are calculated. It is found that:

a PCE increase rate (26%) in Example 1 is significantly higher than a sum (18%+3%=21%) of increase rates in Comparative Examples 4 and 6;

a PCE increase rate (28%) in Example 2 is significantly higher than a sum (3%+2%=5%) of increase rates in Comparative Examples 2 and 5;

a PCE increase rate (31%) in Example 3 is significantly higher than a sum (7%+8%=15%) of increase rates in Comparative Examples 3 and 7; and a PCE increase rate (32%) in Example 4 is significantly higher than a sum (18%+12%=30%) of increase rates in Comparative Examples 4 and 8.

Due to the unexpected synergistic effect between the surfactant and the nitrogen-containing compound, the light absorption property of the photoactive crystalline material layer is significantly improved. Specifically, the percentage p of penetrating crystal grains 313 of the photoactive crystalline material layer is ≥80, and the average flatness index $R_{avg}$ of the photoactive crystalline material layer is ≤75, such that a photovoltaic device with significantly higher power conversion efficiency is obtained.

It should be noted that, this application is not limited to the above embodiments. The above embodiments are merely examples, and all embodiments that fall within the scope of the technical solutions of this application and that have essentially the same construction as the technical idea and the same effect fall within the technical scope of this application. In addition, various variations to the embodiments that can be figured out by persons skilled in the art and other embodiments constructed by combining some constituent elements of the embodiments without departing from the scope of the subject matter of this application also fall within the scope of this application.

The invention claimed is:

1. A photovoltaic device, comprising a photoactive crystalline material layer, wherein the photoactive crystalline material layer comprises a first region;
in the first region, the photoactive crystalline material layer comprises a penetrating crystal grain, wherein the penetrating crystal grain is a crystal grain penetrating through the photoactive crystalline material layer, and a percentage p of a quantity of penetrating crystal grains in a total quantity of crystal grains in the first region of the photoactive crystalline material layer is ≥80%; and
in the first region, the photoactive crystalline material layer comprises a backlight side and a backlight crystal grain, wherein the backlight crystal grain is a crystal grain having at least one face exposed to the backlight side, and the face of the backlight crystal grain exposed to the backlight side is a backlight crystal face, wherein
the backlight side has an average flatness index $R_{avg}$, wherein $10 \leq R_{avg} \leq 70$; and
$R_{avg}$ of the backlight side is calculated according to the following formula:

$$(R_{avg}) = \frac{\sum_{i=1}^{i=n} R_i}{n}$$

wherein $R_i$ is flatness index of the i-th backlight crystal grain in the first region, and $R_i$ is calculated according to the following formula:

$$R_i = d_i/h_i$$

wherein $d_i$ is width of a backlight crystal face of the i-th backlight crystal grain in the first region;
$h_i$ is protrusion height of the backlight crystal face of the i-th backlight crystal grain in the first region; and
n is quantity of all backlight crystal grains in the first region.

2. The photovoltaic device according to claim 1, wherein the photoactive crystalline material comprises an A/M/X crystalline material, and the A/M/X crystalline material has the following general formula:

[A]$_a$[M]$_b$[X]$_c$ wherein [M] comprises one or more first cations, and the first cation comprises a metal ion, a metalloid ion, or a combination thereof;
[A] comprises one or more second cations;
[X] comprises one or more halogen anions;
a is at least 1, 2, 3, 4, 5, or 6;
b is at least 1, 2, 3, 4, 5, or 6; and
c is 1 to 18.

3. The photovoltaic device according to claim 2, wherein one or more of the following are satisfied:
the one or more first cations are selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $P^{d4+}$, $W^{4+}$, $Re^{4+}$, $Os^{4+}$, $Ir^{4+}$, $Pt^{4+}$, $Sn^{4+}$, $Pb^{4+}$, $Ge^{4+}$, or $Te^{4+}$; and
the one or more second cations are selected from $Cs^+$, $(NR^1R^2R^3R^4)^+$, $(R^1R^2N=CR^3R^4)^+$, $(R^1R^2N-C(R^5)=NR^3R^4)^+$, or $(R^1R^2N-C(NR^5R^6)=R^3R^4)^+$, wherein $R^1$, $R^2$, $R^3$, $R^4$, $R^5$, and $R^6$ each are independently selected from H, substituted or unsubstituted $C_{1-20}$ alkyl, or substituted or unsubstituted aryl; and
the halogen anion is selected from $Cl^-$, $Br^-$, or $I^-$.

4. The photovoltaic device according to claim 2, wherein the A/M/X crystalline material comprises $FAPbI_3$, $FAPbBr_3$, $FAPbCl_3$, $FAPbF_3$, $FAPbBr_xI_{3-x}$, $FAPbBr_xCl_{3-x}$, $FAPbI_xBr_{3-x}$, $FAPbI_xCl_{3-x}$, $FAPbCl_xBr_{3-x}$, $FAPbI_{3-x}Cl_x$, $CsPbI_3$, $CsPbBr_3$, $CsPbCl_3$, $CsPbF_3$, $CsPbBr_xI_{3-x}$, $CsPbBr_xCl_{3-x}$, $CsPbI_xBr_{3-x}$, $CsPbI_xCl_{3-x}$, $CsPbCl_xBr_{3-x}$, $CsPbI_{3-x}Cl_x$, $FA_{1-y}Cs_yPbI_3$, $FA_{1-y}Cs_yPbBr_3$, $FA_{1-y}Cs_yPbCl_3$, $FA_{1-y}Cs_yPbF_3$, $FA_{1-y}Cs_yPbBr_xI_{3-x}$, $FA_{1-y}Cs_yPbBr_xCl_{3-x}$, $FA_{1-y}Cs_yPbI_xBr_{3-x}$, $FA_{1-y}Cs_yPbI_xCl_{3-x}$, $FA_{1-y}Cs_yPbCl_xBr_{3-x}$, $FA_{1-y}Cs_yPbI_{3-x}Cl_x$, or a combination thereof,
wherein x=0-3, and y=0.01-0.25.

5. The photovoltaic device according to claim 2, wherein the A/M/X crystalline material comprises $FAPbI_3$, $CsPbI_3$, $FA_{1-y}Cs_yPbI_3$, or a combination thereof, wherein y=0.01-0.25.

6. The photovoltaic device according to claim 2, wherein thickness of the photoactive crystalline material layer is 100 nm or more.

7. The photovoltaic device according to claim 1, further comprising a first charge transport layer and a second charge transport layer, wherein the photoactive crystalline material layer is located between the first charge transport layer and the second charge transport layer; and
the first charge transport layer and the second charge transport layer are respectively an electron transport layer and a hole transport layer; or
the first charge transport layer and the second charge transport layer are respectively a hole transport layer and an electron transport layer.

8. The photovoltaic device according to claim 7, further comprising a first electrode and a second electrode, wherein the electron transport layer, hole transport layer, and photoactive crystalline material layer are located between the first electrode and the second electrode.

9. A preparation method of A/M/X crystalline material, wherein the A/M/X crystalline material has the following general formula:

[A]$_a$[M]$_b$[X]$_c$ wherein [M] comprises one or more first cations, and the first cation comprises a metal ion, a metalloid ion, or a combination thereof;
[A] comprises one or more second cations;
[X] comprises one or more halogen anions;
a is 1 to 6;
b is 1 to 6; and
c is 1 to 18; and
the method comprises providing a precursor composition on a substrate, wherein the precursor composition comprises:
(a) at least one precursor compound;
(b) a solvent;
(c) a surfactant, the surfactant being an amphoteric surfactant; and
(d) an amino compound comprising one or more selected from a nitrile-amine compound, an amino acid compound, a hydrazine compound, a urea compound, a guanidine compound, or a salt or hydrate thereof.

10. The method according to claim 9, wherein the surfactant comprises dodecyl aminopropionate, dodecyl ethoxy sulphobetaine, dodecyl dimethyl hydroxypropyl sulphobetaine, zwitterionic polyacrylamide, octadecyl dihydroxyethyl amine oxide, tetradecyl dihydroxyethyl amine oxide, lauramidopropylamine oxide, lauryl betaine, L-α-phosphatidylcholine, 3-(N,N-dimethylmyristylammonio)propanesulfonate, dodecylbenzene sulfonate, or a combination thereof.

11. The method according to claim 9, wherein the amino compound comprises urea formaldehyde ($C_3H_8N_2O_3$), N,N"-(isobutylidene)diurea ($C_6H_{14}N_4O_2$), hydrazine ($H_4N_2$), guanidine ($CH_3N_3O$), cyanamide ($CH_2N_2$), or a combination thereof.

12. The method according to claim 9, wherein the precursor composition comprises a first solvent and a second solvent, a boiling point of the first solvent is 40° C.-165° C., and a boiling point of the second solvent is 170° C.-250° C.

13. The method according to claim 12, wherein, one or more of the following are satisfied:
    (1) the first solvent is selected from one or more of N,N-dimethylformamide (DMF), 2-methoxyethanol, and acetonitrile (ACN);
    (2) the second solvent is selected from one or more of dimethyl sulfoxide (DMSO), N-methylpyrrolidone (NMP), and diphenyl sulfoxide (DPSO); and
    (3) a volume ratio of the first solvent to the second solvent is (4-10):1.

14. The method according to claim 9, wherein the precursor composition comprises:
    a first precursor compound, wherein the first precursor compound contains a first cation; and
    a second precursor compound, wherein the second precursor compound contains a second cation.

15. The method according to claim 14, wherein one or more of the following are satisfied:
    (1) the first precursor compound contains a first halogen anion; and
    (2) the second precursor compound contains a second halogen anion.

16. The method according to claim 14 wherein, one or more of the following are satisfied:
    (1) the first precursor compound comprises lead iodide ($PbI_2$), lead bromide ($PbBr_2$), or a combination thereof; and
    (2) the second precursor compound comprises formamidinium iodide (FAI), formamidinium bromide (FABr), cesium iodide (CsI), cesium bromide (CsBr), or a combination thereof.

17. The method according to claim 9, further comprising implementing curing treatment on the precursor composition provided on a surface of the substrate.

18. The method according to claim 17, further comprising implementing annealing treatment on a resulting product of the curing treatment.

19. A method for preparing a photovoltaic device the method comprises:
    providing a first electrode;
    providing a first charge transport layer on a surface of the first electrode;
    forming an A/M/X crystalline material layer on a surface of the first charge transport layer, wherein forming the A/M/X crystalline material layer further comprises:
    providing a precursor composition on the surface of the first charge transport layer, wherein the precursor composition comprises:
    (a) a first precursor compound and a second precursor compound, the first precursor compound comprising a first cation and a first halogen anion, and the second precursor compound comprising a second cation and a second halogen anion;
    (b) a solvent;
    (c) a surfactant, the surfactant being an amphoteric surfactant; and
    (d) an amino compound comprising one or more selected from a nitrile-amine compound, an amino acid compound, a hydrazine compound, a urea compound, a guanidine compound, or a salt or hydrate thereof;
    implementing curing treatment on the precursor composition; and
    implementing annealing treatment on a resulting product of the curing treatment;
    forming a second charge transport layer on the A/M/X crystalline material layer; and
    forming a second electrode on the second charge transport layer,
    wherein the A/M/X crystalline material has the following general formula:

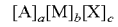

wherein [M] represents the first cation;
[A] represents the second cations;
[X] represents the first and second halogen anions;
a is 1 to 6;
b is 1 to 6; and
c is 1 to 18;
wherein the first charge transport layer and the second charge transport layer are respectively an electron transport layer and a hole transport layer; or
the first charge transport layer and the second charge transport layer are respectively a hole transport layer and an electron transport layer.

20. The method according to claim 19, wherein
the first precursor compound comprises lead iodide ($PbI_2$), lead bromide ($PbBr_2$), or a combination thereof,
the second precursor compound comprises formamidinium iodide (FAI), formamidinium bromide (FABr), cesium iodide (CsI), cesium bromide (CsBr), or a combination thereof,
the surfactant comprises dodecyl aminopropionate, dodecyl ethoxy sulphobetaine, dodecyl dimethyl hydroxypropyl sulphobetaine, zwitterionic polyacrylamide, octadecyl dihydroxyethyl amine oxide, tetradecyl dihydroxyethyl amine oxide, lauramidopropylamine oxide, lauryl betaine, L-α-phosphatidylcholine, 3-(N,N-dimethylmyristylammonio) propanesulfonate, dodecylbenzene sulfonate, or a combination thereof,
the amino compound comprises urea formaldehyde ($C_3H_8N_2O_3$), N,N"-(isobutylidene)diurea ($C_6H_{14}N_4O_2$), hydrazine ($H_4N_2$), guanidine ($CH_3N_3O$), cyanamide ($CH_2N_2$), or a combination thereof.

* * * * *